United States Patent
Choi

(10) Patent No.: US 11,367,492 B2
(45) Date of Patent: Jun. 21, 2022

(54) PAGE BUFFER AND OPERATING METHOD THEREOF

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/154,337

(22) Filed: Jan. 21, 2021

(65) Prior Publication Data

US 2022/0028467 A1     Jan. 27, 2022

(30) Foreign Application Priority Data

Jul. 24, 2020   (KR) .................. 10-2020-0092619

(51) Int. Cl.
| | |
|---|---|
| *G11C 7/00* | (2006.01) |
| *G11C 16/34* | (2006.01) |
| *G11C 16/10* | (2006.01) |
| *G11C 16/30* | (2006.01) |
| *G11C 16/24* | (2006.01) |
| *G11C 16/26* | (2006.01) |

(52) U.S. Cl.
CPC .......... *G11C 16/3454* (2013.01); *G11C 16/10* (2013.01); *G11C 16/24* (2013.01); *G11C 16/26* (2013.01); *G11C 16/30* (2013.01)

(58) Field of Classification Search
CPC ....... G11C 7/1051; G11C 7/1078; G11C 7/22; G11C 7/106; G11C 7/1057
USPC ........................................ 365/189.04, 189.16
See application file for complete search history.

(56) References Cited

U.S. PATENT DOCUMENTS

| | | | | |
|---|---|---|---|---|
| 10,734,078 B2* | 8/2020 | Lee | ............... | G11C 16/24 |
| 2011/0051514 A1* | 3/2011 | Han | ............... | G11C 16/3459 |
| | | | | 365/185.09 |

FOREIGN PATENT DOCUMENTS

| | | |
|---|---|---|
| KR | 10-0965067 | 6/2010 |
| KR | 10-2018-0057431 | 5/2018 |

* cited by examiner

*Primary Examiner* — Son T Dinh
(74) *Attorney, Agent, or Firm* — IP & T Group LLP

(57) ABSTRACT

An electronic device is provided. A page buffer includes at least one data latch, a sensing latch, and a bit line voltage controller. At least one data latch stores a program verification result of a previous program loop among a plurality of program loops and program data to be stored in a memory cell. The sensing latch stores a program verification result of a current program loop among the plurality of program loops. The bit line voltage controller updates the program verification result of the previous program loop which is stored in the at least one data latch to the sensing latch during a program operation of a next program loop of the current program loop among the plurality of program loops.

18 Claims, 12 Drawing Sheets

| Latch/PV | ERA | PV1 | PV2 | PV3 | PV4 | PV5 | PV6 | PV7 |
|---|---|---|---|---|---|---|---|---|
| L1(LSB Data) | 0 | 0 | 0 | 1 | 1 | 1 | 1 | 0 |
| L2(CSB Data) | 0 | 0 | 1 | 1 | 0 | 0 | 1 | 1 |
| L3(MSB Data) | 0 | 1 | 1 | 1 | 1 | 0 | 0 | 0 |

PV1 PGM Done

| Latch/PV | ERA | PV1 | PV2 | PV3 | PV4 | PV5 | PV6 | PV7 |
|---|---|---|---|---|---|---|---|---|
| L1(LSB Data) | 0 | 0 | 0 | 1 | 1 | 1 | 1 | 0 |
| L2(CSB Data) | 0 | 0 | 1 | 1 | 0 | 0 | 1 | 1 |
| L3(MSB Data) | 0 | 1 → 0 | 1 | 1 | 1 | 0 | 0 | 0 |

⇒ Perform Program Verify

PAGE BUFFER AND OPERATING METHOD THEREOF

CROSS-REFERENCE TO RELATED APPLICATION

The present application claims priority under 35 U.S.C. § 119(a) to Korean patent application number 10-2020-0092619, filed on Jul. 24, 2020 with the Korean Intellectual Property Office, and which is incorporated herein by reference in its entirety.

BACKGROUND

Field of Invention

Various embodiments of the present disclosure generally relate to an electronic device, and more particularly, to a page buffer and an operating method thereof.

Description of Related Art

A storage device may store data in response to control of a host device such as a computer or a smartphone. A storage device may include a memory device storing data and a memory controller controlling the memory device. Generally, there are two types of memory devices: volatile memory devices and nonvolatile memory devices.

Volatile memory devices may store data only when power is supplied thereto, and may lose data stored therein when power is not supplied. Examples of volatile memory devices include Static Random Access Memory (SRAM) and Dynamic Random Access Memory (DRAM).

Nonvolatile memory devices may retain stored data even when supply of power is interrupted or blocked. Examples of nonvolatile memory devices include Read Only Memory (ROM), Programmable ROM (PROM), Electrically Programmable ROM (EPROM), Electrically Erasable and Programmable ROM (EEPROM), and flash memory.

SUMMARY

Various embodiments of the present disclosure are directed to a page buffer with improved program verify operational performance and a method of operating the page buffer.

According to an embodiment, a method of operating a page buffer performing a plurality of program loops each including a program operation and a program verify operation may include storing a program verification result of a previous program loop among the plurality of program loops in a data latch, storing a program verification result of a current program loop among the plurality of program loops in a sensing latch, and updating the program verification result of the previous program loop which is stored in the data latch to the sensing latch during a program operation of a next program loop among the plurality of program loops.

According to an embodiment, a page buffer may include at least one data latch, a sensing latch, and a bit line voltage controller. At least one data latch may store a program verification result of a previous program loop among a plurality of program loops and program data to be stored in a memory cell. The sensing latch may store a program verification result of a current program loop subsequent to the previous program loop among the plurality of program loops. The bit line voltage controller may update the program verification result of the previous program loop which is stored in the at least one data latch to the sensing latch during a program operation of a next program loop subsequent to the current program loop among the plurality of program loops.

According to an embodiment, a page buffer may include at least one data latch, a sensing latch, and a bit line voltage controller. At least one data latch may store a program verification result of a first program loop, among the first program loop, a second program loop, and a third program loop which are sequentially performed, and program data to be stored in a memory cell. The sensing latch may store a program verification result of the second program loop. The bit line voltage controller may update the program verification result of the first program loop which is stored in the at least one data latch to the sensing latch during a program operation of the third program loop.

According to an embodiment, a circuitry may include a first latch and a second latch that are coupled to a bit line, and a control logic. The control logic sequentially performs first to third program loops to store, in a memory cell coupled to the bit line, data latched in the second latch. The control logic controls the second latch to further latch a first program verification result of the first program loop and the first latch to latch a second program verification result of the second program loop. During the third program loop, the control logic controls the first latch to further latch the first program verification result from the second latch and sets up the bit line based on the first program verification result and the second program verification result from the first latch and controls the second latch to further latch the second program verification result from the first latch.

DETAILED DESCRIPTION

Specific structural and functional descriptions are provided herein only to describe embodiments of the invention. However, the present invention may be configured, arranged, or carried out differently than disclosed herein. Thus, the present invention is not limited to any particular embodiment nor to any specific details. Also, throughout the specification, reference to "an embodiment," "another embodiment" or the like is not necessarily to only one embodiment, and different references to any such phrase are not necessarily to the same embodiment(s). Moreover, the use of an indefinite article (i.e., "a" or "an") means one or more, unless it is clear that only one is intended. Similarly, terms "comprising," "including," "having" and the like, when used herein, do not preclude the existence or addition of one or more other elements in addition to the stated element(s).

Figure 1:
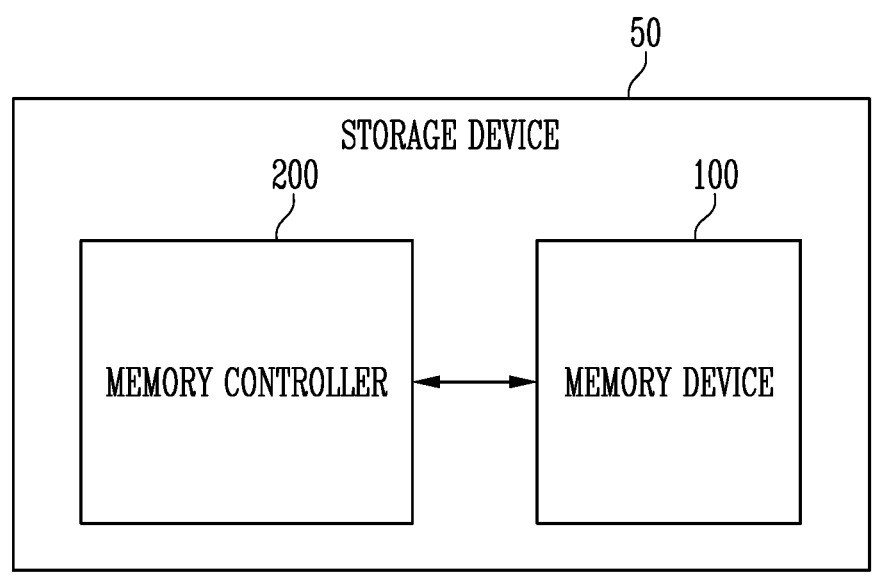
FIG. 1 is a diagram illustrating a storage device according to an embodiment of the present disclosure.

FIG. 1 is a diagram illustrating a storage device 50 according to an embodiment of the present disclosure.

Referring to FIG. 1, the storage device 50 may include a memory device 100 and a memory controller 200 controlling operations of the memory device 100. The storage device 50 may store data in response to control of a host (not shown). Examples of the host include a cellular phone, a smartphone, an MP3 player, a laptop computer, a desktop computer, a game player, a TV, a tablet PC, and an in-vehicle infotainment system.

The storage device 50 may be configured as any of various types of storage devices according to a host interface corresponding to a communication method with the host. For example, the storage device 50 may be configured as any of various types of storage devices such as a solid state drive (SSD), a multimedia card in the form of a multimedia card (MMC), (e.g., an eMMC, an RS-MMC, or a micro-MMC), a secure digital card in the form of an SD (e.g., a mini-SD or a micro-SD), a universal serial bus (USB) storage device, a universal flash storage (UFS) device, a Personal Computer Memory Card International Association (PCMCIA) card type storage device, a peripheral component interconnection (PCI) card type storage device, a PCI express (PCI-e) card type storage device, a compact flash (CF) card, a smart media card, and/or a memory stick.

The storage device 50 may be manufactured as any of various types of packages. For example, the storage device 50 may be manufactured as any of various kinds of package types, such as a package-on-package (POP), a system-in-package (SIP), a system-on-chip (SOC), a multi-chip package (MCP), a chip-on-board (COB), a wafer-level fabricated package (WFP), and/or a wafer-level stack package (WSP).

The memory device 100 may store data. The memory device 100 may operate in response to control of the memory controller 200. The memory device 100 may include a memory cell array including a plurality of memory cells storing data.

Each of the memory cells may be configured as a Single-Level Cell (SLC) storing one bit of data, a Multi-Level Cell (MLC) storing two bits of data, a Triple-Level Cell (TLC) storing three bits of data, or a Quad-Level Cell (QLC) storing four bits of data.

The memory cell array may include a plurality of memory blocks. Each of the memory blocks may include a plurality of memory cells. Each memory block may include a plurality of pages. According to an embodiment, a page may be a unit for storing data in the memory device 100 or reading data stored in the memory device 100.

The memory block may be a unit for erasing data. According to an embodiment, the memory device 100 may be Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), NAND flash memory, Vertical NAND flash memory, NOR flash memory, resistive random access memory (RRAM), phase-change memory (PRAM), magnetoresistive random access memory (MRAM), ferroelectric random access memory (FRAM), or spin-transfer torque random access memory (STT-RAM). By way of example, it is assumed that the memory device 100 is NAND flash memory in the context of the following description.

The memory device 100 may receive a command and an address from the memory controller 200, and access an area selected by the address in the memory cell array. That is, the memory device 100 may perform an operation that the command instructs on the area selected by the address. For example, the memory device 100 may perform a write operation (or a program operation), a read operation, and an erase operation. During the program operation, the memory device 100 may program the area selected by the address with data. During the read operation, the memory device 100 may read data from the area selected by the address. During the erase operation, the memory device 100 may erase data stored in the area selected by the address.

The memory controller 200 may control general operation of the storage device 50.

When power is applied to the storage device 50, the memory controller 200 may execute firmware FW. When the memory device 100 is a flash memory device, the memory controller 200 may execute firmware such as a Flash Translation Layer (FTL) for controlling communication between the host and the memory device 100.

According to an embodiment, the memory controller 200 may receive data and a Logical Block Address (LBA) from the host and translate the LBA into a Physical Block Address (PBA) indicating an address of memory cells in which data is to be stored in the memory device 100.

The memory controller 200 may control the memory device 100 to perform a program operation, a read operation, or an erase operation in response to a request from the host. During the program operation, the memory controller 200 may provide a write command, a physical block address, and data to the memory device 100. During the read operation, the memory controller 200 may provide a read command and a physical block address to the memory device 100. During the erase operation, the memory controller 200 may provide an erase command and the PBA to the memory device 100.

According to an embodiment, the memory controller 200 may generate and transfer a command, an address, and data to the memory device 100 regardless of a request from the host. For example, the memory controller 200 may provide a command, an address, and data to the memory device 100 to perform background operations, such as a program operation for wear leveling and a program operation for garbage collection.

According to an embodiment, the memory controller 200 may control at least two memory devices 100. The memory controller 200 may control the memory devices 100 according to an interleaving scheme so as to improve operational performance. In the interleaving scheme, operating periods of two or more memory devices 100 may at least partially overlap.

The host may communicate with the storage device 50 using at least one of various communication methods such as a Universal Serial Bus (USB), Serial AT Attachment (SATA), a Serial Attached SCSI (SAS), a High Speed Interchip (HSIC), a Small Computer System Interface (SCSI), a Peripheral Component Interconnection (PCI), PCI express (PCIe), NonVolatile Memory express (NVMe), Universal Flash Storage (UFS), Secure Digital (SD), a MultiMedia Card (MMC) of an embedded MMC (eMMC), a Dual In-line Memory Module (DIMM), a Registered DIMM (RDIMM), and/or a Load Reduced DIMM (LRDIMM).

Figure 2:
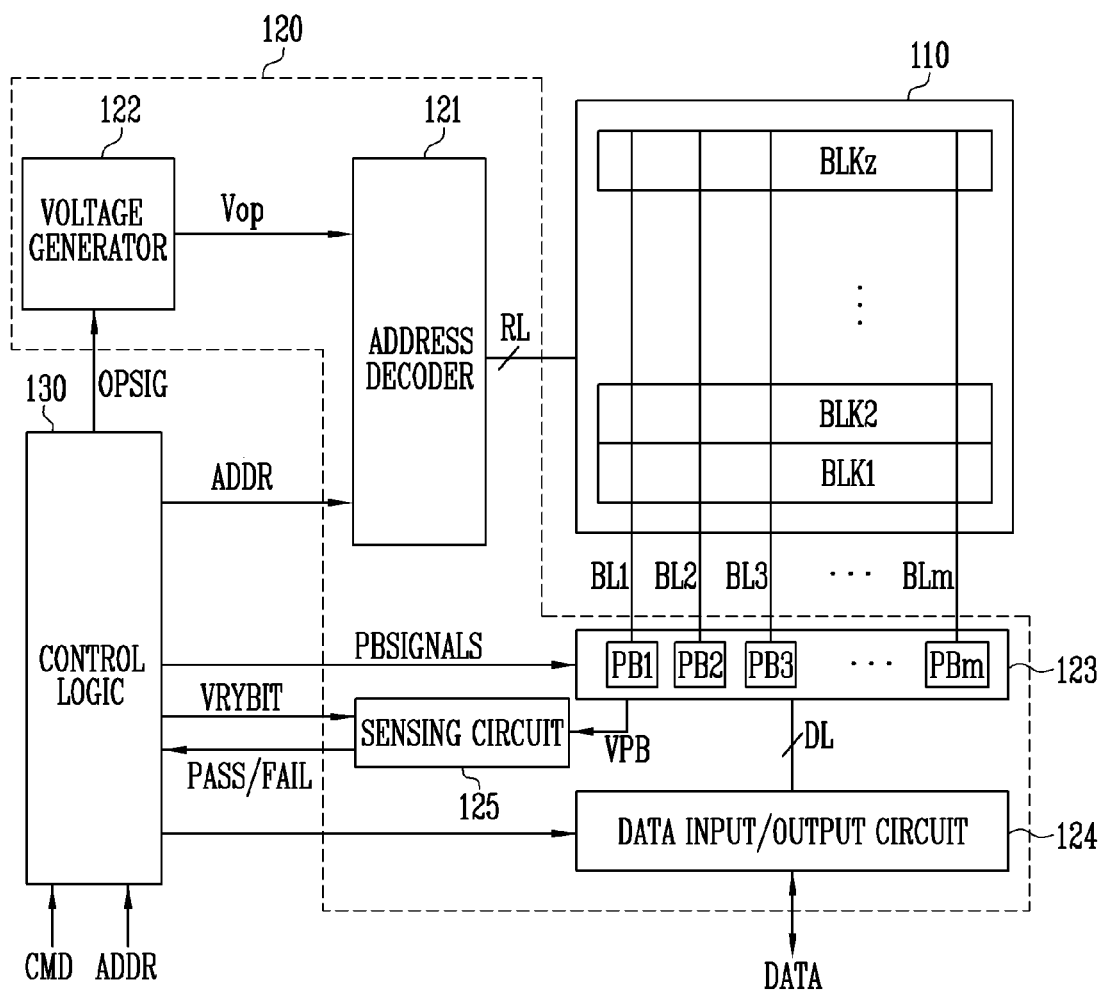
FIG. 2 is a diagram illustrating a structure of a memory device, such as that shown in FIG. 1.

FIG. 2 is a diagram illustrating a structure of the memory device 100 shown in FIG. 1.

Referring to FIG. 2, the memory device 100 may include a memory cell array 110, a peripheral circuit 120, and a control logic 130.

The memory cell array 110 may include a plurality of memory blocks BLK1 to BLKz, which may be coupled to an address decoder 121 through row lines RL. The plurality of memory blocks BLK1 to BLKz may be coupled to a read and write circuit 123 through bit lines BL1 to BLm. Each of the plurality of memory blocks BLK1 to BLKz may include a plurality of memory cells. According to an embodiment, the plurality of memory cells may be nonvolatile memory cells. Among the plurality of memory cells, memory cells coupled to the same word line may be defined as one physical page. In other words, the memory cell array 110 may include a plurality of physical pages. According to an embodiment, each of the plurality of memory blocks BLK1 to BLKz included in the memory cell array 110 may include a plurality of dummy cells. At least one dummy cell may be coupled in series between a drain select transistor and the memory cells and between a source select transistor and the memory cells.

Each of the memory cells of the memory device 100 may be a Single-Level Cell (SLC) storing one bit of data, a Multi-Level Cell (MLC) storing two bits of data, a Triple-Level Cell (TLC) storing three bits of data, or a Quad Level-Cell (QLC) storing four bits of data.

The peripheral circuit 120 may include the address decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 to perform a program operation, a read operation, and an erase operation.

The address decoder 121 may be coupled to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 may be configured to operate in response to control of the control logic 130. The address decoder 121 may receive an address ADDR from the control logic 130.

The address decoder 121 may be configured to decode a block address of the received address ADDR. The address decoder 121 may select at least one memory block among the memory blocks BLK1 to BLKz according to the decoded block address. The address decoder 121 may be configured to decode a row address of the received address ADDR. The address decoder 121 may select at least one word line among word lines of the memory block selected according to the decoded row address. The address decoder 121 may apply an operating voltage Vop supplied from the voltage generator 122 to a selected word line.

During a program operation, the address decoder 121 may apply a program voltage to the selected word line and a pass voltage lower than the program voltage to unselected word lines. During a program verify operation, the address decoder 121 may apply a verify voltage to the selected word line and a verify pass voltage higher than the verify voltage to the unselected word lines.

During a read operation, the address decoder 121 may apply a read voltage to the selected word line and a read pass voltage higher than the read voltage to the unselected word lines.

According to an embodiment of the present disclosure, the memory device 100 may perform an erase operation on each memory block. During the erase operation, the address ADDR input to the memory device 100 may include a block address. The address decoder 121 may decode the block address and select at least one memory block in response to the decoded block address. During the erase operation, the address decoder 121 may apply a ground voltage to word lines coupled to the selected memory block.

According to an embodiment of the present disclosure, the address decoder 121 may be configured to decode a column address of the transferred address ADDR. The decoded column address may be transferred to the read and write circuit 123. For example, the address decoder 121 may include components such as a row decoder, a column decoder and an address buffer.

The voltage generator 122 may be configured to generate a plurality of operating voltages Vop by using an external power voltage supplied to the memory device 100. The voltage generator 122 may operate in response to control of the control logic 130.

According to an embodiment, the voltage generator 122 may generate an internal power voltage by regulating an external power voltage. The internal power voltage generated by the voltage generator 122 may be used as an operating voltage for the memory device 100.

According to an embodiment, the voltage generator 122 may generate the plurality of voltages Vop by using the external power voltage or the internal power voltage. The voltage generator 122 may be configured to generate various voltages used by the memory device 100. For example, the voltage generator 122 may generate a plurality of erase voltages, a plurality of program voltages, a plurality of pass voltages, a plurality of selected read voltages, and a plurality of unselected read voltages.

The voltage generator 122 may include a plurality of pumping capacitors receiving the internal power voltage to generate the plurality of operating voltages Vop having various voltage levels, and may generate the plurality of operating voltages Vop by selectively activating the plurality of pumping capacitors in response to control of the control logic 130.

The plurality of operating voltages Vop may be supplied to the memory cell array 110 by the address decoder 121.

The read and write circuit 123 may include first to mth page buffers PB1 to PBm, which may be coupled to the memory cell array 110 through the first to mth bit lines BL1 to BLm, respectively. The first to mth page buffers PB1 to PBm may operate in response to control of the control logic 130.

The first to mth page buffers PB1 to PBm may communicate data DATA with the data input/output circuit 124. During a program operation, the first to mth page buffers PB1 to PBm may receive the data DATA to be stored through the data input/output circuit 124 and data lines DL.

During a program operation, when a program voltage is applied to the selected word line, the first to mth page buffers PB1 to PBm may transfer the data DATA to be stored, which is received through the data input/output circuit 124, to the selected memory cells through the bit lines BL1 to BLm. Memory cells of a selected page may be programmed according to the transferred data DATA. A memory cell coupled to a bit line to which a program permission voltage (for example, a ground voltage) is applied may have an increased threshold voltage. A threshold voltage of a memory cell coupled to a bit line to which a program inhibition voltage (for example, a power voltage) is applied may be maintained. During a program verify operation, the first to mth page buffers PB1 to PBm may read the data DATA stored in the memory cells through the bit lines BL1 to BLm from the selected memory cells.

During a read operation, the read and write circuit 123 may read the data DATA through the bit lines BL1 to BLm from the memory cells of the selected page and may store the read data DATA in the first to mth page buffers PB1 to PBm.

During an erase operation, the read and write circuit 123 may float the bit lines BL1 to BLm. According to an embodiment, the read and write circuit 123 may include a column select circuit.

The data input/output circuit 124 may be coupled to the first to mth page buffers PB1 to PBm through the data lines DL. The data input/output circuit 124 may operate in response to control of the control logic 130.

The data input/output circuit 124 may include a plurality of input/output buffers (not shown) receiving the input data DATA. During a program operation, the data input/output circuit 124 may receive the data DATA to be stored from an external controller (not shown). During a read operation, the data input/output circuit 124 may output the data DATA transferred from the first to mth page buffers PB1 to PBm included in the read and write circuit 123 to the external controller.

During a read operation or a verify operation, the sensing circuit 125 may generate a reference current in response to an allowable bit VRYBIT signal generated by the control logic 130 and may output a pass signal or a fail signal to the control logic 130 by comparing a sensing voltage VPB received from the read and write circuit 123 with a reference voltage generated by the reference current.

The control logic 130 may be coupled to the address decoder 121, the voltage generator 122, the read and write circuit 123, the data input/output circuit 124, and the sensing circuit 125. The control logic 130 may be configured to control general operation of the memory device 100. The control logic 130 may operate in response to a command CMD transferred from an external device.

The control logic 130 may control the peripheral circuit 120 by generating various signals in response to the command CMD and the address ADDR. For example, the control logic 130 may output an operation signal OPSIG, the address ADDR, read and write circuit control signals PBSIGNALS, and the allowable bit VRYBIT in response to the command CMD and the address ADDR. The control logic 130 may output the operation signal OPSIG to the voltage generator 122, output the address ADDR to the address decoder 121, output the read and write circuit control signals PBSIGNALS to the read and write circuit 123, and output the allowable bit VRYBIT to the sensing circuit 125. In addition, the control logic 130 may determine whether a verify operation passes or fails in response to a pass or fail signal PASS/FAIL output from the sensing circuit 125.

Figure 3:
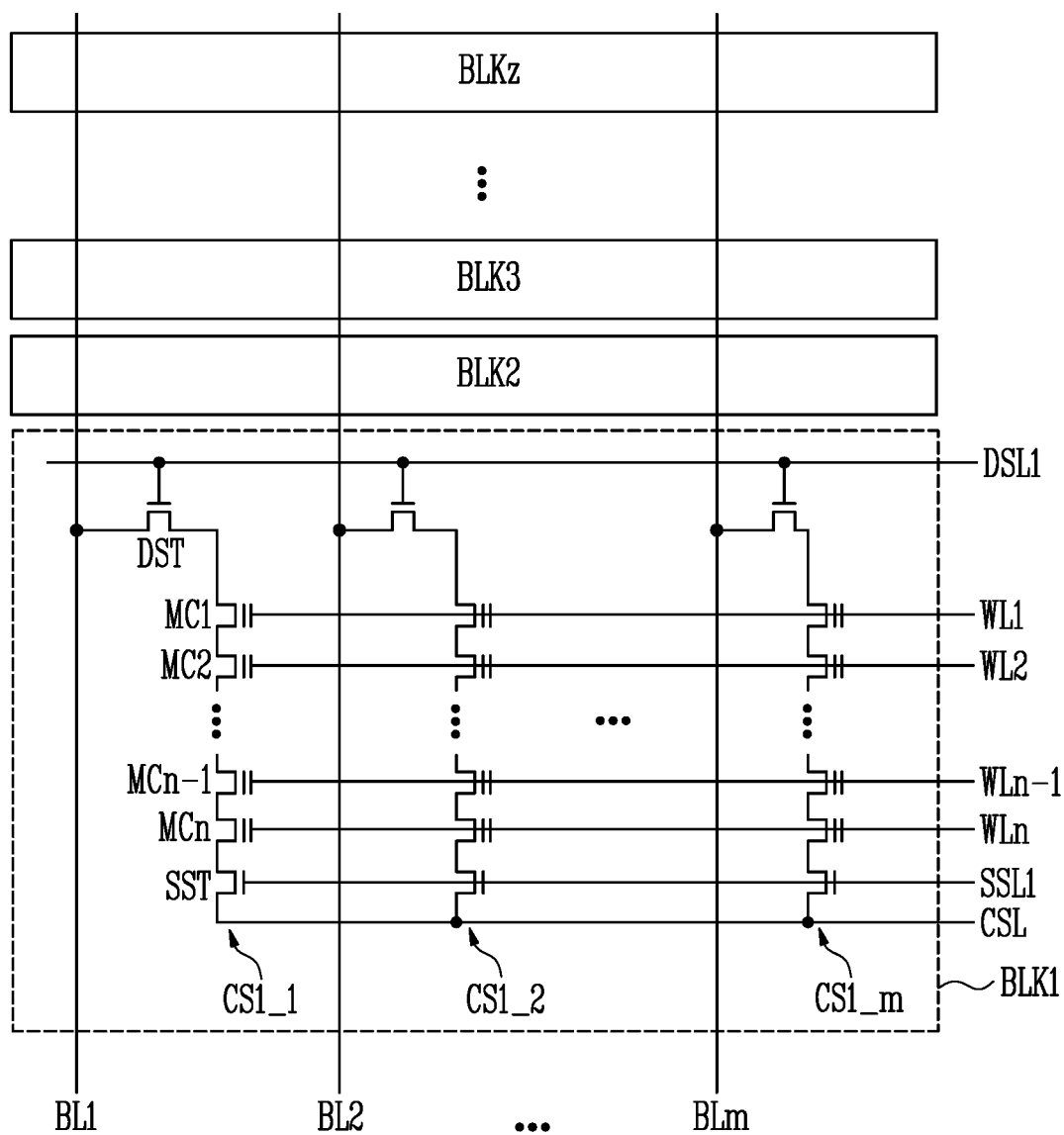
FIG. 3 is a diagram illustrating a memory cell array, such as that shown in FIG. 2.

FIG. 3 is a diagram illustrating the memory cell array 110 shown in FIG. 2.

Referring to FIG. 3, the first to zth memory blocks BLK1 to BLKz may be coupled to the first to mth bit lines BL1 to BLm in common. In FIG. 3, by way of example, components included in the first memory block BLK1, among the plurality of memory blocks BLK1 to BLKz, are illustrated. However, it is understood that each of the remaining memory blocks BLK2 to BLKz may be configured in substantially the same manner as the first memory block BLK1.

The memory block BLK1 may include a plurality of cell strings CS1_1 to CS1_$m$, where m is a positive integer of 2 or more. The first to mth cell strings CS1_1 to CS1_$m$ may be coupled to the first to mth bit lines BL1 to BLm, respectively. Each of the first to mth cell strings CS1_1 to CS1_$m$ may include a drain select transistor DST, a plurality of memory cells MC1 to MCn coupled in series, and a source select transistor SST, where n is a positive integer of 2 or more.

A gate terminal of the drain select transistor DST included in each of the first to mth cell strings CS1_1 to CS1_$m$ may be coupled to a drain select line DSL1. Gate terminals of the first to nth memory cells MC1 to MCn included in each of the first to mth cell strings CS1_1 to CS1_$m$ may be coupled to first to nth word lines WL1 to WLn, respectively. A gate terminal of the source select transistor SST included in each of the first to mth cell strings CS1_1 to CS1_$m$ may be coupled to a source select line SSL1.

By way of example, a structure of the first cell string CS1_1, among the plurality of cell strings CS1_1 to CS1_$m$, is described. However, it is understood that each of the remaining cell strings CS1_2 to CS1_$m$ may be configured in substantially the same manner as the first cell string CS1_1.

A drain terminal of the drain select transistor DST included in the first cell string CS1_1 may be coupled to the first bit line BL1. A source terminal of the drain select transistor DST included in the first cell string CS1_1 may be coupled to a drain terminal of the first memory cell MC1 included in the first cell string CS1_1. The first to nth memory cells MC1 to MCn may be coupled to each other in series. A drain terminal of the source select transistor SST included in the first cell string CS1_1 may be coupled to a source terminal of the nth memory cell MCn included in the first cell string CS1_1. A source terminal of the source select transistor SST included in the first cell string CS1_1 may be coupled to a common source line CSL. According to an embodiment, the common source line CSL may be coupled to the first to zth memory blocks BLK1 to BLKz in common.

The drain select line DSL1, the first to nth word lines WL1 to WLn, and the source select line SSL1 may be included in the row lines RL shown in FIG. 2. The drain select line DSL1, the first to nth word lines WL1 to WLn, and the source select line SSL1 may be controlled by the address decoder 121. The common source line CSL may be controlled by the control logic 130. The first to mth bit lines BL1 to BLm may be controlled by the read and write circuit 123.

Figure 4:
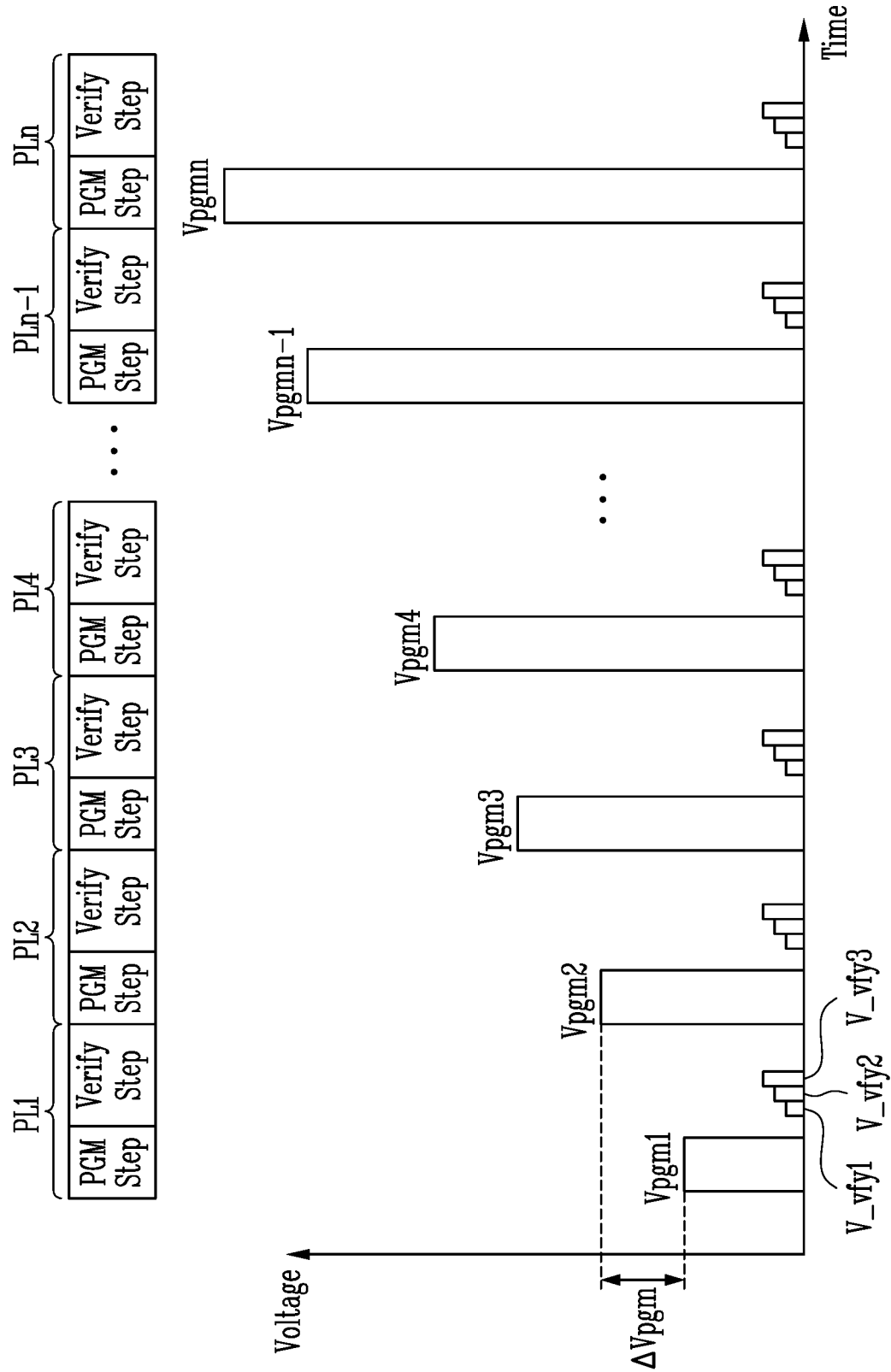
FIG. 4 is a diagram illustrating a program operation of a memory device, such as that shown in FIG. 2.

FIG. 4 is a diagram illustrating a program operation of a memory device, such as that shown in FIG. 2.

In FIG. 4, by way of example, it is assumed that each of the memory cells is a Multi-Level Cell (MLC) storing two bits of data. However, the invention is not limited thereto, and each of the memory cells may be a Triple-Level Cell (TLC) storing three bits of data or a Quad-Level Cell (QLC) storing four bits of data. More generally, the number of bits of data stored in a memory cell may be one or more.

A memory device may perform a plurality of program loops PL1 to PLn such that each of selected memory cells may be programmed to have a threshold voltage corresponding to one of a plurality of program states P1, P2, and P3.

Each of the plurality of program loops PL1 to PLn may include a program step (PGM Step) in which a program voltage is applied to a selected word line coupled to selected memory cells and a program verify step (Verify Step) in which verify voltages are applied to determine whether the selected memory cells are programmed.

For example, when the first program loop PL1 is performed, first to third verify voltages V_vfy1 to V_vfy3 may be sequentially applied to verify program states of selected memory cells after a first program pulse Vpgm1 is applied. Memory cells each having the first program state P1 as a target program state may be verified by the first verify voltage V_vfy1. Memory cells each having the second program state P2 as a target program state may be verified by the second verify voltage V_vfy2. Memory cells each having the third program state P3 as a target program state may be verified by the third verify voltage V_vfy3.

The memory cells determined to have passed verification via application of the first to third verify voltages V_vfy1 to V_vfy3 may be determined to have the target program states. These memory cells may be program-inhibited in all subsequent program loops starting with the second program loop PL2. In other words, from the second program loop PL2, a program inhibition voltage may be applied to a bit line coupled to a memory cell determined as verify pass.

To program the remaining, non-program-inhibited memory cells in the second program loop PL2, a second program pulse Vpgm2 higher than the first program pulse Vpgm1 by a unit voltage ΔVpgm may be applied to a selected word line. Subsequently, a verify operation may be performed in the same manner as the verify operation of the first program loop PL1. For example, verify pass may indicate that a memory cell is read as an off-cell by a corresponding verify voltage.

As described above, when the memory device 100 programs the Multi-Level Cell (MLC) storing two bits of data, the memory device 100 may verify each of the memory cells having the program states as the target program states by using the first to third verify voltages V_vfy1 to V_vfy3, respectively.

A verify voltage may be applied to a selected word line, that is, a word line to which selected memory cells are coupled, and the page buffer shown in FIG. 2 may determine verify pass of each of the memory cells based on a current or a voltage flowing through bit lines coupled to the selected memory cells, respectively.

Figure 5:
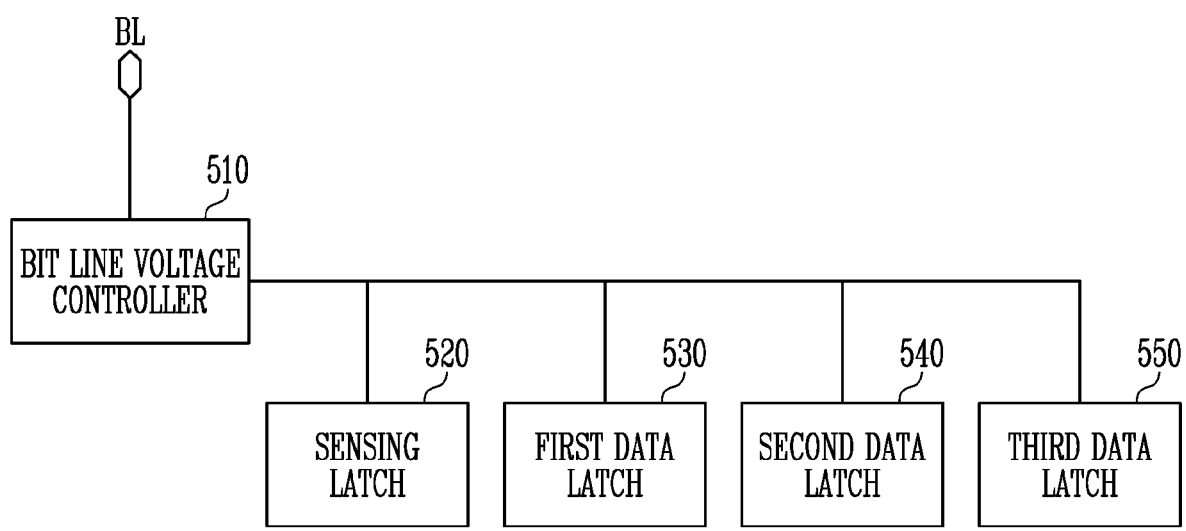
FIG. 5 is a diagram illustrating a page buffer according to an embodiment of the present disclosure.

FIG. 5 is a diagram illustrating a page buffer according to an embodiment shown in FIG. 2.

Referring to FIG. 5, a page buffer 500 may include a bit line voltage controller 510, a sensing latch 520, a first data latch 530, a second data latch 540, and a third data latch 550. However, the number of data latches included in the page buffer 500 is not limited to three; any suitable number of data latches may be included in the page buffer 500.

How many data latches are included is based on the number of bits stored in a memory cell. In FIG. 5, by way of example, it is assumed that each memory cell is a Triple-Level Cell (TLC) storing three bits. However, the number of bits stored in a single memory cell is not limited to three; the page buffer 500 to accommodate memory cells of different storage capacities consistent with the teachings herein.

The bit line voltage controller 510 may be coupled to the memory cell through a bit line BL. The bit line voltage controller 510 may store data sensed from a memory cell in the sensing latch 520 during a read operation or a verify operation. The bit line voltage controller 510 may control a voltage of the bit line BL based on data stored in the sensing latch 520 during a program operation. The bit line voltage controller 510 may apply a program permission voltage to the bit line BL when a memory cell is being programmed. The bit line voltage controller 510 may apply a program inhibition voltage to the bit line BL when the memory cell is completely programmed.

The sensing latch 520 may store a program verification result of a program loop which is currently executed among a plurality of program loops. According to an embodiment, when program verification has passed, the sensing latch 520 may store a first logical value. When the program verification has failed, the sensing latch 520 may store an inverted first logical value.

The first, second, and third data latches 530, 540, and 550 may store program data to be stored in the memory cell. Depending on the program data stored in the first, second, and third data latches 530, 540, and 550, a memory cell coupled to the bit line BL may be programmed to have a threshold voltage corresponding to one of a plurality of program states.

According to an embodiment, the first data latch 530 may store LSB data. The second data latch 540 may store CSB data. The third data latch 550 may store MSB data. However, the type of data stored in each of data latches is not limited to this configuration.

The first, second, and third data latches 530, 540, and 550 may store program data and a program verification result of a previous program loop among the plurality of program loops.

As described above with reference to FIG. 4, each of the plurality of program loops may include a program operation and a program verify operation.

The program operation may include a bit line set-up operation and a program pulse applying operation. The bit line set-up operation may set a voltage of a bit line to a program inhibition voltage or a program permission voltage depending on whether a memory cell is completely programmed. The program pulse applying operation may apply a program voltage to a word line coupled to the memory cell after the voltage of the bit line is set up.

The program verify operation may determine whether the memory cell is completely programmed. When a threshold voltage of the memory cell is higher than or equal to a verify voltage, the memory cell is completely programmed and program verification may pass. When the threshold voltage of the memory cell is lower than the verify voltage, the memory cell is not completely programmed and the program verification may fail.

According to an embodiment, the bit line voltage controller 510 may update the program verification result of the previous program loop, which is stored in the first, second, and third data latches 530, 540, and 550, to the sensing latch 520 in a program loop subsequent to a current program loop (next program loop). According to an embodiment, the previous program loop may be the program loop immediately before the current program loop. According to an embodiment, the previous program loop may be all program loops before the current program loop.

According to an embodiment, the bit line voltage controller 510 may update the program verification result of the previous program loop, which is stored in the first, second, and third data latches 530, 540, and 550, to the sensing latch 520 during a program operation of a next program loop.

According to an embodiment, the bit line voltage controller 510 may update the program verification result of the previous program loop, which is stored in the first, second, and third data latches 530, 540, and 550, to the sensing latch 520 during a bit line set-up operation in the program operation of the next program loop.

According to an embodiment, the bit line voltage controller 510 may update the program verification result of the previous program loop, which is stored in the first, second, and third data latches 530, 540, and 550, to the sensing latch 520 after the current program loop is completed.

The bit line voltage controller 510 may set a voltage of the bit line BL based on a data value of the sensing latch 520. The data value of the sensing latch 520 may include a program verification result of the current program loop and the program verification result of the previous program loop, which is updated to the sensing latch 520.

The bit line voltage controller 510 may update the program verification result of the current program loop, which is stored in the sensing latch 520, to the first, second, and third data latches 530, 540, and 550 during a bit line set-up operation in a next program loop. According to an embodiment, the bit line voltage controller 510 may update the program verification result of the current program loop to at least one of the first, second, and third data latches 530, 540, and 550 during the bit line set-up operation in the next program loop.

According to an embodiment, the first, second, and third data latches 530, 540, and 550 may store a program verification result of a first program loop among first, second, and third program loops, which are sequentially performed, and program data to be stored in the memory cell.

The sensing latch 520 may store a program verification result of the second program loop.

The bit line voltage controller 510 may update the program verification result of the first program loop, which is stored in the first, second, and third data latches 530, 540, and 550, to the sensing latch 520 during a program operation of the third program loop. The bit line voltage controller 510 may set a voltage of the bit line BL coupled to the memory cell based on the program verification result of the first program loop which is updated to the sensing latch 520, and the program verification result of the second program loop. The bit line voltage controller 510 may update the program verification result of the second program loop, which is stored in the sensing latch 520, to the first, second, and third data latches 530, 540, and 550 during the program operation of the third program loop.

Figure 6:
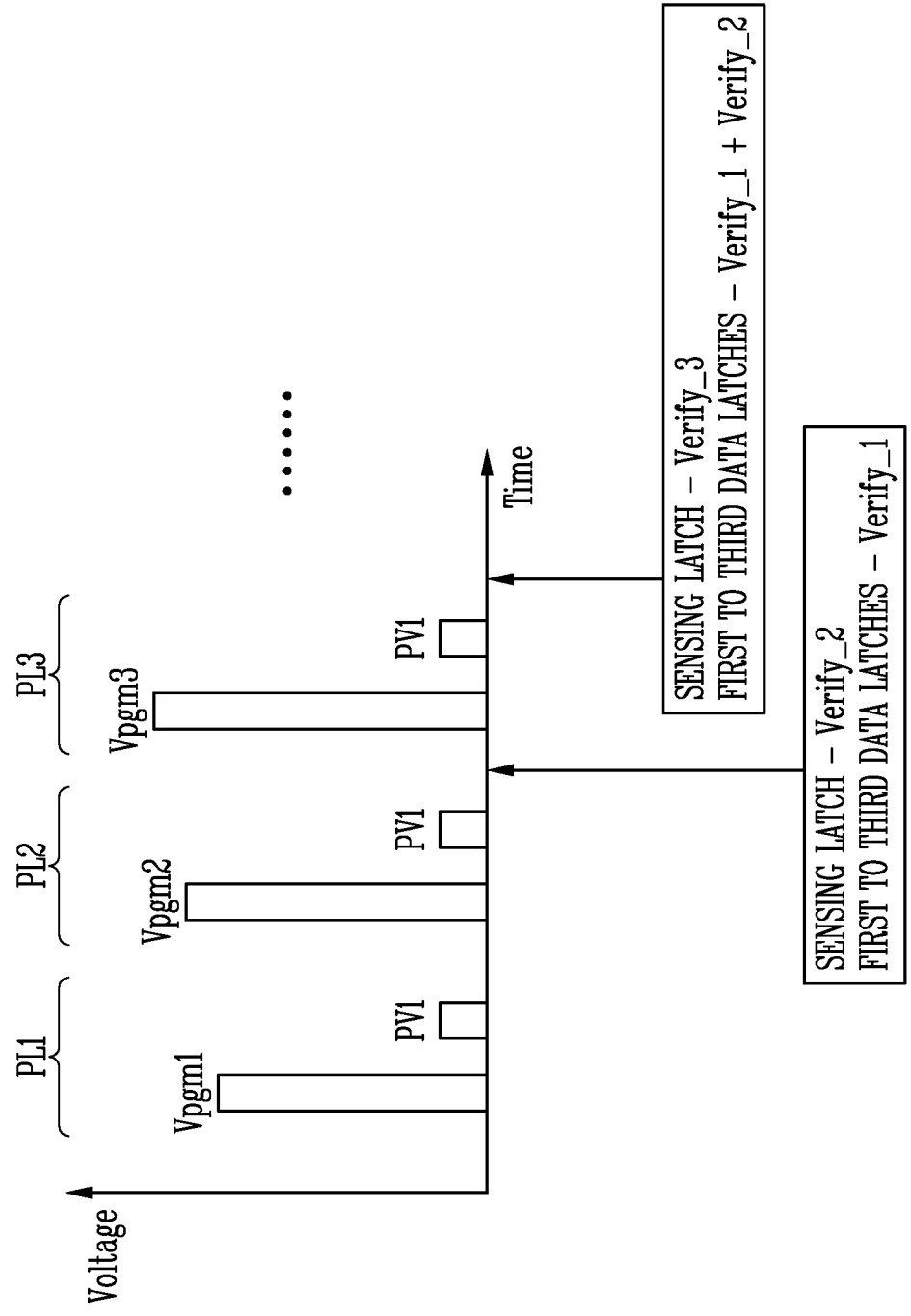
FIG. 6 is a diagram illustrating an operation of updating a program verification result in a program loop.

FIG. 6 is a diagram illustrating an operation of updating a program verification result in a program loop.

Referring to FIG. 6, a plurality of program loops may be performed. Each of the plurality of program loops may be performed by an Incremental Step Pulse Program (ISPP) scheme as described above with reference to FIG. 4.

A program verify operation for each of one or more program states among a plurality of program states may be performed in each program loop.

In FIG. 6, the first, second, and third program loops PL1, PL2, and PL3 may be sequentially performed among the plurality of program loops. A program verify operation for a first program state PV1 among the plurality of program states may be performed in the first, second, and third program loops PL1, PL2, and PL3. However, the number of program states for which program verify operations are performed in each program loop is not limited to this embodiment.

After the second program loop PL2 is completed, the sensing latch described above with reference to FIG. 5 may store a program verification result Verify_2 of the second program loop PL2. The first, second, and third data latches may store a program verification result Verify_1 of the first program loop PL1 which is the program loop immediately before the second program loop PL2.

After the third program loop PL3 is completed, the sensing latch may store a program verification result Verify_3 of the third program loop PL3. The first, second, and third data latches may store the program verification results Verify_1 and Verify_2 of the first and second program loops PL1 and PL2 which are the previous program loop of the third program loop PL3.

Figure 7:
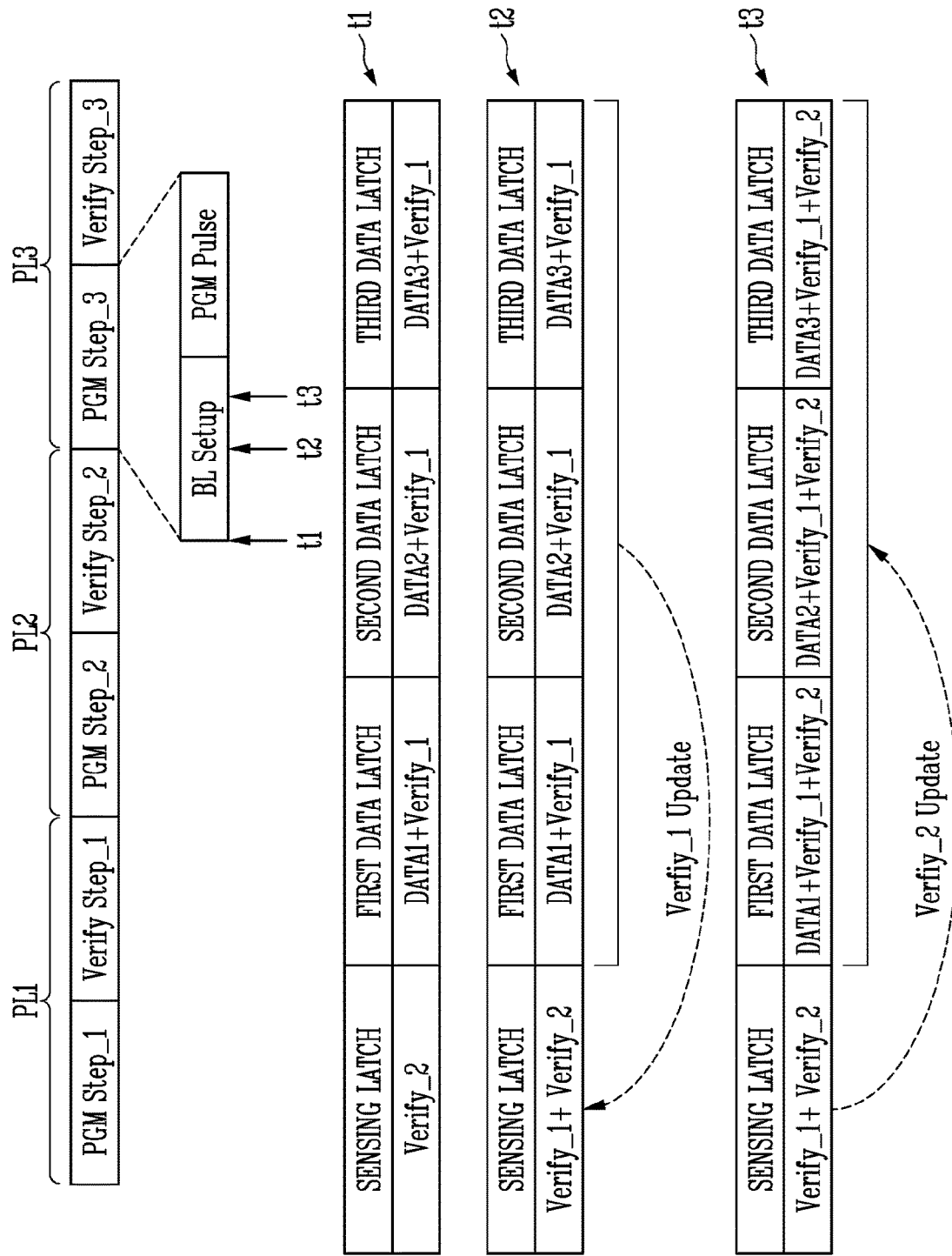
FIG. 7 is a detailed diagram illustrating an operation of updating a program verification result, such as that obtained in FIG. 6.

FIG. 7 is a detailed diagram illustrating an operation of updating a program verification result shown in FIG. 6.

Referring to FIG. 7, the first, second, and third data latches may store program data DATA1, DATA2, and DATA3 to be stored in a memory cell.

Times t1, t2, and t3 occur after the second program loop PL2 is completed. The times t1, t2, and t3 may be included in a period during which a bit line set-up operation BL Setup of the third program loop PL3 is performed.

At the time t1, the sensing latch may store the program verification result Verify_2 of the second program loop PL2. The first, second, and third data latches may store the program verification result Verify_1 of the first program loop PL1 which is the program loop immediately before the second program loop PL2.

At the time t2, the program verification result Verify_1 of the first program loop PL1, which is stored in the first, second, and third data latches, may be updated to the sensing latch (Verify_1 Update). A voltage of a bit line coupled to a memory cell may be set based on the program verification result Verify_1 of the first program loop PL1, which is updated to the sensing latch, and the program verification result Verify_2 of the second program loop PL2.

At the time t3, the program verification result Verify_2 of the second program loop PL2, which is stored in the sensing latch, may be updated to the first, second, and third data latches (Verify_2 Update).

After the third program loop PL3 is completed, the first, second, and third data latches may store the program data DATA1, DATA2, and DATA3 and the program verification results Verify_1 and Verify_2 of the previous first and second program loops PL1 and PL2.

Figures 8, 9:
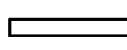
FIG. 8 is a diagram illustrating a data value of a data latch according to an embodiment of the present disclosure.
FIG. 9 is a diagram illustrating a change in a data value of a data latch as a program operation is performed.

FIG. 8 is a diagram illustrating a data value of a data latch according to an embodiment.

Referring to FIG. 8, a memory cell may be a Triple-Level Cell (TLC) storing three bits.

A first data latch L1 may store least significant bit (LSB) data. A second data latch L2 may store central significant bit (CSB) data. A third data latch L3 may store most significant bit (MSB) data.

The memory cell may be programmed to one of an erase state ERA and a plurality of program states PV1 to PV7 depending on program data stored in the first, second, and third data latches L1, L2, and L3.

Bits of data corresponding to the erase state ERA may be '000'. Bits of data corresponding to the first program state PV1 may be '100'. Bits of data corresponding to the second program state PV2 may be '110'. Bits of data corresponding to the third program state PV3 may be '111'. Bits of data corresponding to the fourth program state PV4 may be '101'. Bits of data corresponding to the fifth program state PV5 may be '001'. Bits of data corresponding to the sixth program state PV6 may be '011'. Bits of data corresponding to the seventh program state PV7 may be '010'. However, bits of data corresponding to each of states is not limited to this embodiment.

FIG. 9 is a diagram illustrating a change in data value of a data latch as a program operation is performed.

Referring to FIG. 9, memory cells may be programmed to one of the erase state ERA and the plurality of program states PV1 to PV7 depending on program data stored in data latches. The program operation on the memory cells may be sequentially performed in order from the first program state PV1 to the seventh program state PV7.

In FIG. 9, bits of data corresponding to a memory cell to be programmed to the first program state PV1 may be '100'. The first data latch L1 of a page buffer coupled to the corresponding memory cell may store 0 as LSB data. The second data latch L2 may store 0 as CSB data. The third data latch L3 may store 1 as MSB data.

According to an embodiment, when a memory cell is completely programmed to a target program state, a data latch of a page buffer coupled to the memory cell may be set to store bits of data having a set pattern. In FIG. 9, the set pattern may be '000'. However, the set pattern is not limited to this embodiment.

For example, when a program operation for the first program state PV1 is completed, a data value of the third data latch L3 of a page buffer coupled to the memory cell programmed to the first program state PV1 may be changed from 1 to 0.

Figure 10:
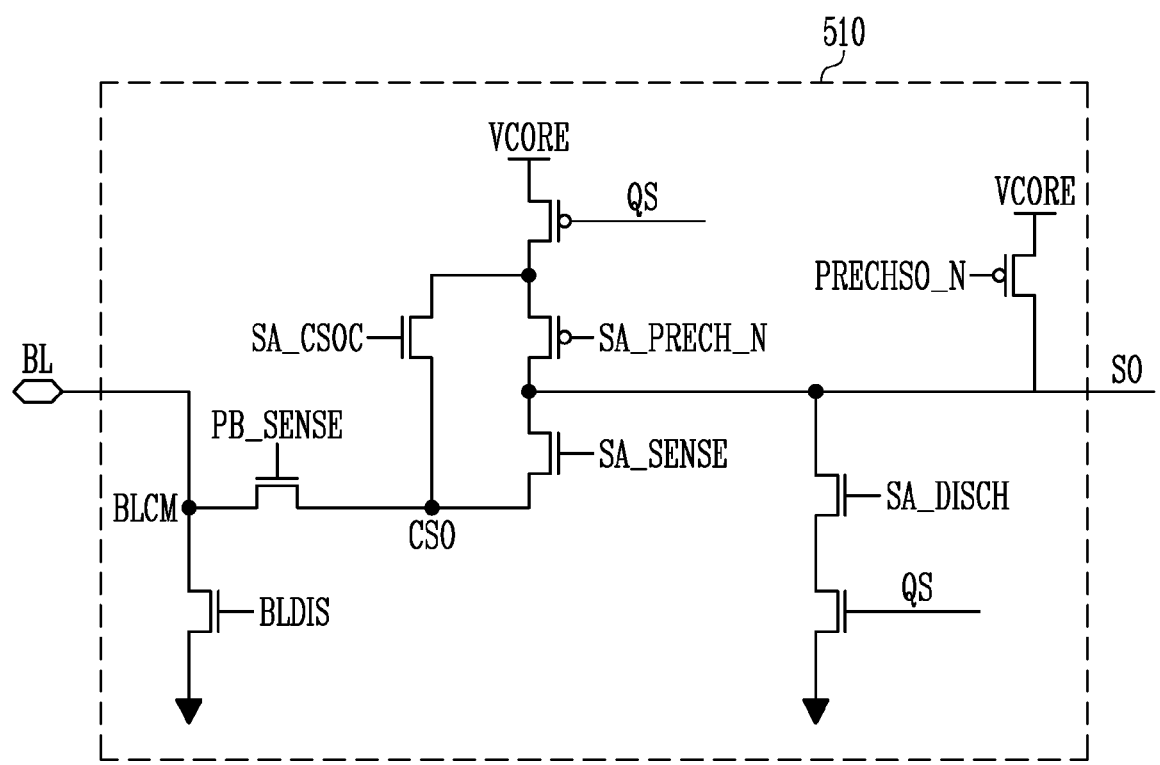
FIG. 10 is a diagram illustrating a bit line voltage controller according to an embodiment of the present disclosure.

FIG. 10 is a diagram illustrating a bit line voltage controller according to an embodiment shown in FIG. 5.

Referring to FIG. 10, the bit line voltage controller 510 may be coupled to the bit line BL. The bit line BL may be coupled to a sensing node SO depending on a page buffer control signal PB_SENSE and a sense amplifier sense signal SA_SENSE.

A potential of the bit line BL may be precharged to a program inhibition voltage or discharged to a program permission voltage depending on a data value of a node QS of the sensing latch 520 to be described below with reference to FIG. 11. According to an embodiment, the program inhibition voltage may be a power voltage VCORE. The program permission voltage may be a ground voltage. During a bit line set-up operation for setting a voltage of a bit line, a first precharge signal SA_PRECH_N, the sense amplifier sense signal SA_SENSE, the page buffer control signal PB_SENSE, and a sense amplifier discharge signal SA_DISCH may be activated. Periods in which respective signals are activated may be variously set.

For example, when a data value of the node QS of the sensing latch 520 is a first logical value, a bit line may be precharged. When a data value of the node QS of the sensing latch 520 is an inverted first logical value, a bit line may be discharged. In FIG. 10, the first logical value may be 0. According to another embodiment, the first logical value may be 1 depending on a type of a transistor.

Figure 11:
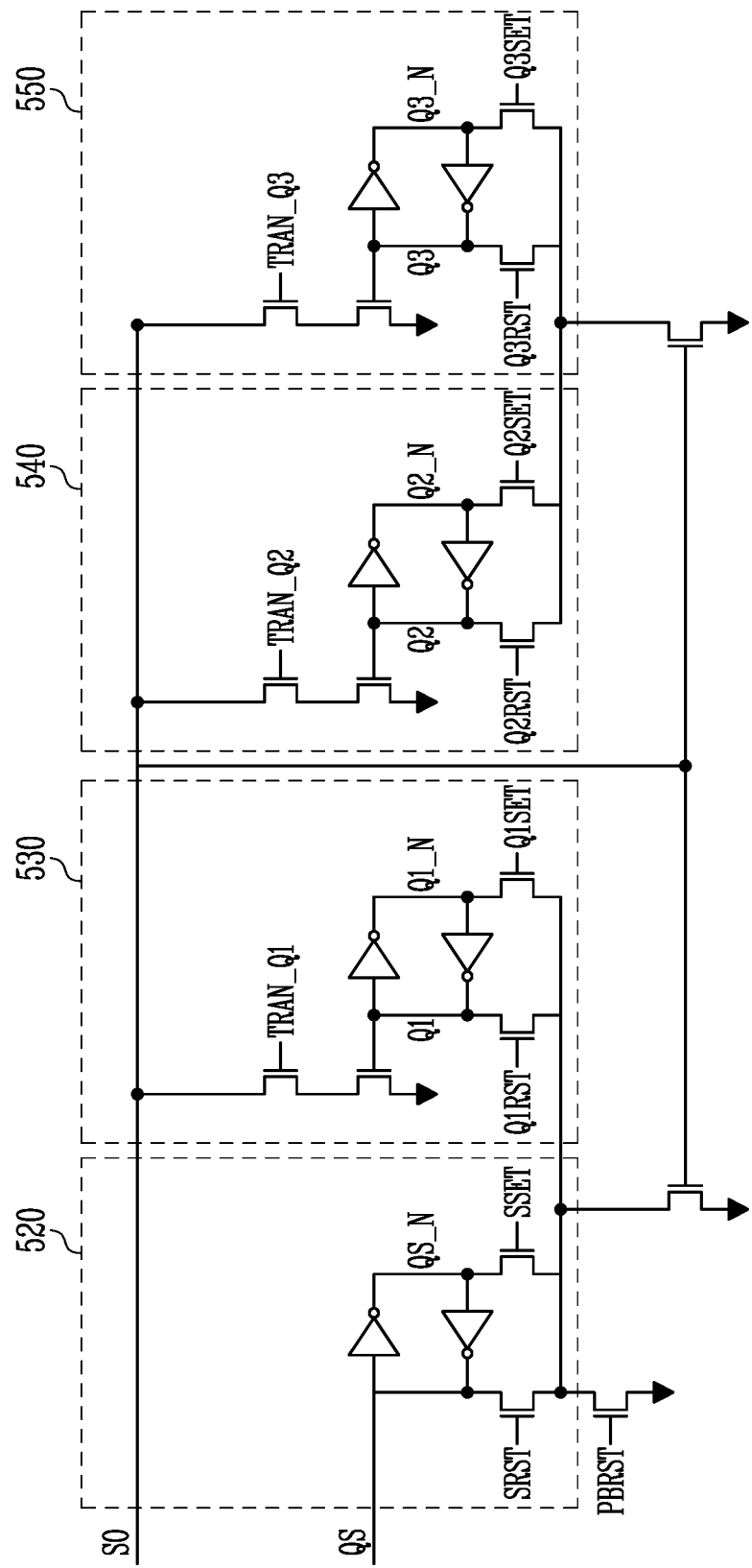
FIG. 11 is a diagram illustrating a sensing latch and a data latch according to an embodiment of the present disclosure.

A second precharge signal PRECHSO_N may be activated when a program verification result of a previous program loop, which is stored in the first, second, and third data latches 530, 540, and 550 to be described below with reference to FIG. 11, is updated to the sensing latch 520.

FIG. 11 is a diagram illustrating a sensing latch and a data latch according to an embodiment shown in FIG. 5.

Referring to FIG. 11, the sensing latch 520, the first data latch 530, the second data latch 540, and the third data latch 550 may be coupled to each other by the sensing node SO.

A program verification result of a previous program loop, which is stored in the first, second, and third data latches 530, 540, and 550, may be updated to the sensing latch 520 during a bit line set-up operation. A voltage of a bit line coupled to a memory cell may be set based on a data value of the node QS of the sensing latch 520. A program verification result of a current program loop, which is stored in the sensing latch 520, may be updated to the first, second, and third data latches 530, 540, and 550.

An update operation of the program verification result between the sensing latch 520 and each of the data latches is described with reference to FIG. 12 in detail.

Figure 12:
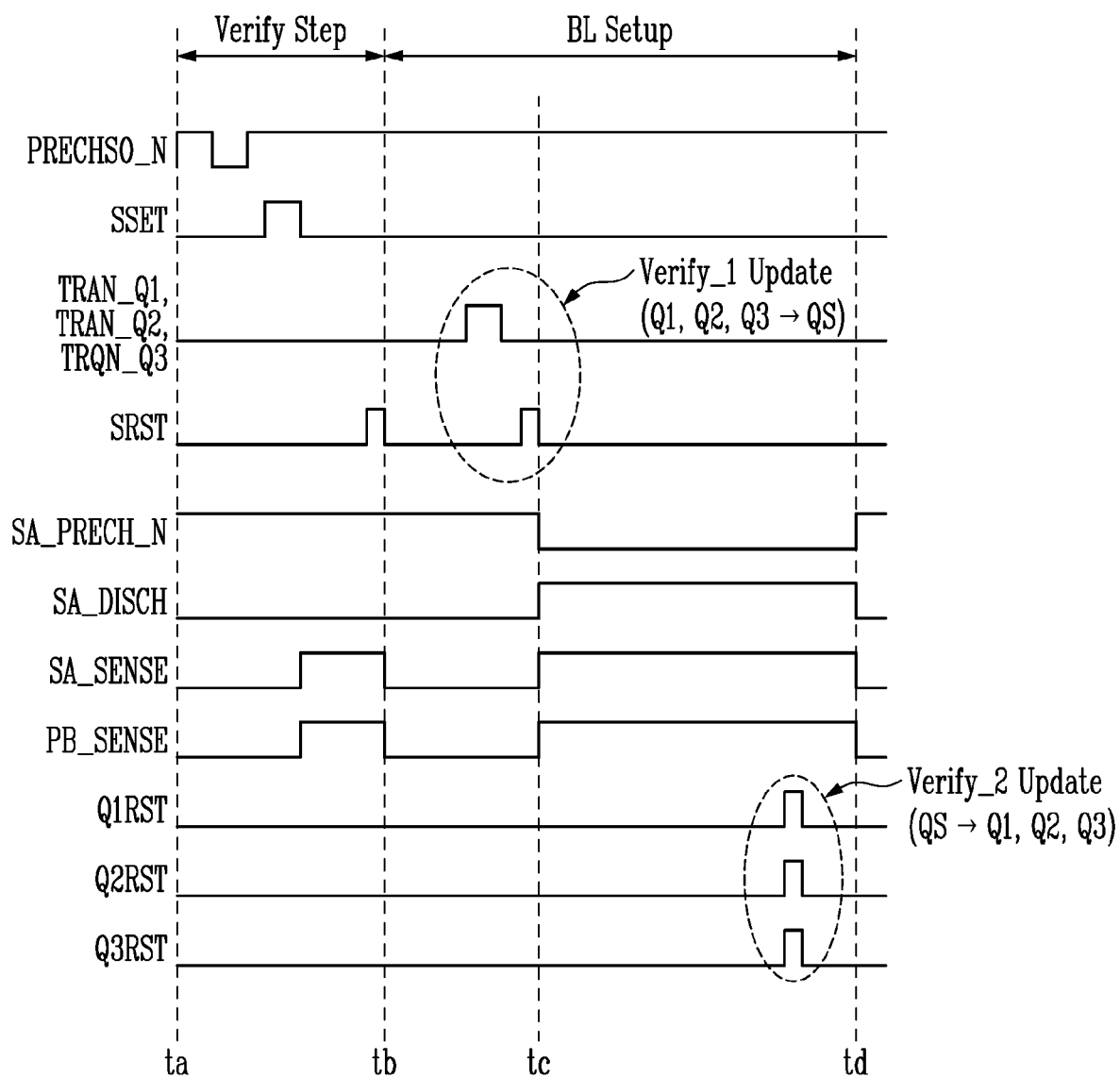
FIG. 12 is a timing diagram illustrating an operation of a page buffer according to an embodiment of the present disclosure.

FIG. 12 is a timing diagram illustrating an operation of a page buffer according to an embodiment.

Referring to FIGS. 10 to 12, a program verify operation may be performed at the program verify step (Verify Step) in the current program loop. The program verify operation may be for determining whether a memory cell is completely programmed in the current program loop.

In FIG. 12, when a potential of a node is high, a data value of the corresponding node may be 1, and when the potential of the node is low, the data value of the corresponding node may be 0. According to another embodiment, when a potential of a node is high, a data value of the corresponding node may be 0, and when the potential of the node is low, the data value of the corresponding node may be 1.

When the second precharge signal PRECHSO_N is activated during the program verify operation, the sense node SO may be precharged to a high level and a data value may be 1.

When a set signal SSET of the sensing latch 520 is activated, a data value of the node QS of the sensing latch 520 may be set to 1. For example, because the sense node SO has a high level, when the set signal SSET is activated, an inverting node QS_N of the sensing latch 520 may be connected to a ground voltage node. Thus, the inverting node QS_N of the sensing latch 520 may be discharged to a low level. Because a data value of the inverting node QS_N of the sensing latch 520 is 0, a data value of the node QS of the sensing latch 520 may be set to 1.

After the sense node SO is precharged to a high level, the sense amplifier sense signal SA_SENSE and the page buffer control signal PB_SENSE may be activated. When the sense amplifier sense signal SA_SENSE and the page buffer control signal PB_SENSE are activated, the bit line BL and the sensing node SO may be connected.

A bit line current does not flow when a threshold voltage of a memory cell is higher than or equal to a verify voltage, and therefore a potential of the sensing node SO may be maintained at a high level. In other words, when a program verify operation passes, the sensing node SO may store 1 as a data value.

A bit line current flows when a threshold voltage of a memory cell is lower than a verify voltage, and therefore a potential of the sensing node SO may be discharged to a low level. In other words, when a program verify operation fails, the sensing node SO may store 0 as a data value.

When a reset signal SRST of the sensing latch 520 is activated, a data value of the sensing node SO may be inverted and stored in the node QS of the sensing latch 520.

For example, when the reset signal SRST of the sensing latch 520 is activated when a data value of the sensing node SO is 0, a data value of the node QS of the sensing latch 520 may be maintained at 1, which is a previous data value. When a data value of the sensing node SO is 1, when the reset signal SRST of the sensing latch 520 is activated, a data value of the node QS of the sensing latch 520 may be changed from 1 to 0.

A program operation may be performed during a program step in the next program loop after the program verify step (Verify Step) in the current program loop. The program operation may include a bit line set-up operation and a program pulse applying operation. In FIG. 12, by way of example, only the bit line set-up operation BL Setup in the next program loop is illustrated.

In a period between tb and tc in the bit line set-up operation of the next program loop, a value of a program verification result of a previous program loop, which is stored in each of respective nodes Q1, Q2, and Q3 of the first, second, and third data latches 530, 540, and 550, may be updated to a data value of the node QS of the sensing latch 520.

Respective transmission signals TRAN_Q1, TRAN_Q2, and TRAN_Q3 of the first, second, and third data latches 530, 540, and 550 may be activated.

When all of a first data value stored in the node Q1 of the first data latch 530, a second data value stored in the node Q2 of the second data latch 540, and a third data value stored in the node Q3 of the third data latch 550 are 0, the sensing node SO may maintain a previous data value.

When at least one of the first data value, the second data value, and the third data value is not 0, a data value of the sensing node SO may be set to 0.

As described above with reference to FIG. 9, when a program operation for a target program state is completed, a program verify operation may pass and all of the first, second, and third data values may be set to 0.

In other words, when the program operation for the target program state is completed and thus the program verify operation passes in the program verify step of the current program loop, all of the first, second, and third data values may be set to 0 and the sensing node SO may maintain the previous data value. When the program operation for the target program state is not completed and thus the program verify operation fails in the program verify step of the current program loop, at least one of the first, second, and third data values is not 0. Accordingly, the data value of the sensing node SO may be set to 0.

When the reset signal SRST of the sensing latch 520 is activated, when a data value of the sensing node SO is 1, a data value of the node QS of the sensing latch 520 may be set to 0. When the reset signal SRST of the sensing latch 520 is activated, when a data value of the sensing node SO is 0, a data value of the node QS of the sensing latch 520 may maintain a previous data value.

In a period between tc and td in the bit line set-up operation BL Setup of the next program loop, a value of a program verification result of a current program loop, which is stored in the node QS of the sensing latch 520, may be updated to a data value of each of the respective nodes Q1, Q2, and Q3 of the first, second, and third data latches 530, 540, and 550.

The first precharge signal SA_PRECH_N, the sense amplifier sense signal SA_SENSE, the page buffer control signal PB_SENSE, and the sense amplifier discharge signal SA_DISCH may be activated.

The data value of the node QS of the sensing latch 520 may be inverted and stored in the sensing node SO. When the data value of the node QS of the sensing latch 520 is 0, the sensing node SO is precharged to a high level, and therefore the data value of the sensing node SO may be 1. When the data value of the node QS of the sensing latch 520 is 1, the sensing node SO is discharged to a low level, and therefore the data value of the sensing node SO may be 0.

When the data value of the sensing node SO is 1, when a reset signal Q1RST of the first data latch 530 is activated, a data value of the node Q1 of the first data latch 530 may be set to 0. When a reset signal Q2RST of the second data latch 540 is activated, a data value of the node Q2 of the second data latch 540 may be set to 0. When a reset signal Q3RST of the third data latch 550 is activated, a data value of the node Q3 of the third data latch 550 may be set to 0.

That is, when the data value of the sensing node SO is 1, the data value of the sensing node SO may be inverted and stored in each of the respective nodes Q1, Q2, and Q3 of the first, second, and third data latches 530, 540, and 550. According to another embodiment, a reset signal of a data latch may be separately activated by each of data latches. According to this embodiment, a value of a current program verification result may be updated to only a data latch of which a reset signal is activated.

When the data value of the sensing node SO is 0, when the reset signal Q1RST of the first data latch 530 is activated, the node Q1 of the first data latch 530 may maintain a previous data value. When the reset signal Q2RST of the second data latch 540 is activated, the node Q2 of the second data latch 540 may maintain a previous data value. When the reset signal Q3RST of the third data latch 550 is activated, the node Q3 of the third data latch 550 may maintain a previous data value.

Referring to FIG. 9, it may be assumed that a program verify operation for the first program state PV1 is performed in a time period between to and tb of the program verify step in the current program loop. In a page buffer coupled to a memory cell, the node Q1 of the first data latch 530 may store 0. The node Q2 of the second data latch 540 may store 0. The node Q3 of the third data latch 550 may store 1.

According to an embodiment, it is assumed that a program verify operation of a current program loop fails in the time period between ta and tb of the program verify step in the current program loop.

In a period between ta and tb of the program verify step in the current program loop, a data value of the node QS of the sensing latch 520 may be set to 1 at present. Because the program verify operation fails, a data value of the sensing node SO may be set to 0. The data value of the node QS of the sensing latch 520 may be maintained at 1 which is the previous data value.

In the period between tb and tc in the bit line set-up operation of the next program loop, because the first, second, third data values do not correspond to a case where all of the first data value stored in the node Q1 of the first data latch 530, the second data value stored in the node Q2 of the second data latch 540, and the third data value stored in the node Q3 of the third data latch 550 are 0 (e.g., when the first program state PV1 is '100', as illustrated in FIG. 9), the data value of the sensing node SO may be set to 0. Because the data value of the sensing node SO is 0, a data value of the node QS of the sensing latch 520 may be maintained at 1.

In the period between tc and td of the bit line set-up operation in the next program loop, because the data value of the node QS of the sensing latch 520 is 1, the sensing node SO is discharged to a low level, and the data value of the sensing node SO may be set to 0. A program permission voltage having a ground voltage level may be applied to the bit line BL.

Because the data value of the sensing node SO is 0, the first data value stored in the node Q1 of the first data latch 530 may be maintained at 0. The second data value stored in the node Q2 of the second data latch 540 may be maintained at 0. The third data value stored in the node Q3 of the third data latch 550 may be maintained at 1.

According to an embodiment, it is assumed that the program verify operation of the current program loop passes in the time period between ta and tb of the program verify step in the current program loop.

In the period between ta and tb of the program verify step in the current program loop, the data value of the node QS of the sensing latch 520 may be set to 1 at present. Because the program verify operation passes, the data value of the sensing node SO may be set to 1. The data value of the node QS of the sensing latch 520 may be set from 1 to 0.

In the period between tb and tc of the bit line set-up operation in the next program loop, because the first, second, third data values do not correspond to a case where all of the first data value stored in the node Q1 of the first data latch 530, the second data value stored in the node Q2 of the second data latch 540, and the third data value stored in the node Q3 of the third data latch 550 are 0 (e.g., when the first program state PV1 is '100', as illustrated in FIG. 9), the data value of the sensing node SO may be set to 0. Because the data value of the sensing node SO is 0, a data value of the node QS of the sensing latch 520 may be maintained at 0.

In the period between tc and td of the bit line set-up operation BL Setup in the next program loop, because the data value of the node QS of the sensing latch 520 is 0, the sensing node SO is precharged to a high level, and the data value of the sensing node SO may be set to 1. A program inhibition voltage having a power voltage level may be applied to the bit line BL.

Because the data value of the sensing node SO is 1, the first data value stored in the node Q1 of the first data latch 530 may be set to 0. The second data value stored in the node Q2 of the second data latch 540 may be set to 0. The third data value stored in the node Q3 of the third data latch 550 may be set from 1 to 0.

When all data values stored in data latches are 0, these data values may indicate that a program verify operation for the first program state PV1 passes.

Therefore, a program operation and a program verify operation for the second program state PV2 may be performed in the next program loop subsequent to the current program loop.

Figure 13:
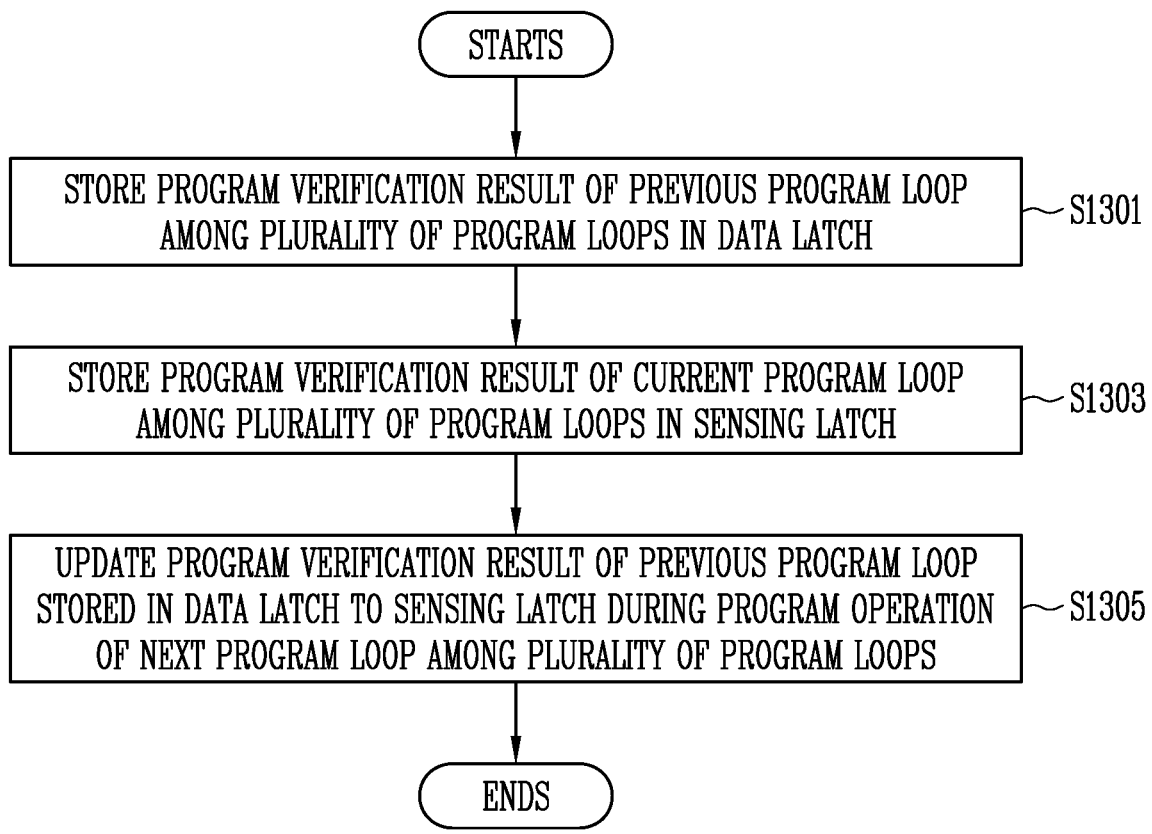
FIG. 13 is a flowchart illustrating an operation of updating a verification result of a previous program loop to a sensing latch according to an embodiment of the present disclosure.

FIG. 13 is a flowchart illustrating an operation of updating a verification result of a previous program loop to a sensing latch according to an embodiment.

Referring to FIG. 13, at operation S1301, a page buffer may store a program verification result of the previous program loop among a plurality of program loops to a data latch. The number of data latches included in the page buffer may be one or more.

At operation S1303, the page buffer may store a program verification result of the current program loop among the plurality of program loops to the sensing latch.

At operation S1305, the page buffer may update the program verification result of the previous program loop, which is stored in the data latch, to the sensing latch during a program operation of the next program loop among the plurality of program loops.

Figure 14:
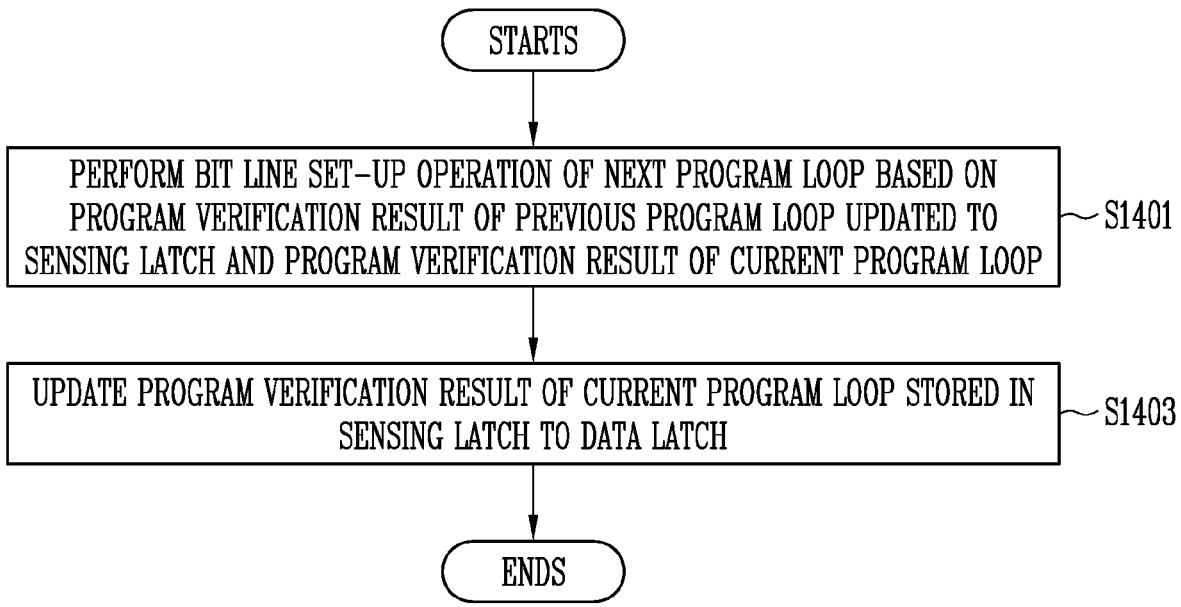
FIG. 14 is a flowchart illustrating an operation of updating a verification result of a current program loop to a data latch according to an embodiment of the present disclosure.

FIG. 14 is a flowchart illustrating an operation of updating a verification result of a current program loop to a data latch according to an embodiment.

Referring to FIG. 14, at operation S1401, a page buffer may perform a bit line set-up operation of the next program loop based on a program verification result of the previous program loop, which is updated to the sensing latch, and a program verification result of the current program loop, which is stored in the sensing latch.

At operation S1403, the page buffer may update the program verification result of the current program loop, which is stored in the sensing latch, to the data latch during the bit line set-up operation of the next program loop.

According to embodiments of the present disclosure, a page buffer with improved program verify operational performance and a method of operating the page buffer are provided.

While the present invention has been illustrated and described in connection with various embodiments, those skilled in the art will understand in view of the present disclosure that various modifications may be made within the scope of the invention. Thus, the present invention encompasses all modifications that fall within the scope of the claims.

What is claimed is:

1. A method of operating a page buffer performing a plurality of program loops each including a program operation and a program verify operation, the method comprising:
storing a program verification result of a previous program loop among the plurality of program loops in a data latch;
storing a program verification result of a current program loop among the plurality of program loops in a sensing latch; and
updating the program verification result of the previous program loop, which is stored in the data latch, to the sensing latch during a program operation of a next program loop among the plurality of program loops.

2. The method of claim 1, further comprising performing a bit line set-up operation of the program operation of the next program loop based on the program verification result of the previous program loop, which is updated to the sensing latch, and the program verification result of the current program loop.

3. The method of claim 2, wherein the performing of the bit line set-up operation includes applying a program permission voltage or a program inhibition voltage to a bit line coupled to a memory cell based on the program verification result of the previous program loop and the program verification result of the current program loop.

4. The method of claim 1, further comprising updating the program verification result of the current program loop, which is stored in the sensing latch, to the data latch during the program operation of the next program loop.

5. The method of claim 4, wherein the updating of the program verification result of the current program loop to the data latch is performed after the updating of the program verification result of the previous program loop to the sensing latch.

6. The method of claim 1, wherein the plurality of program loops are performed by an Incremental Step Pulse Program scheme.

7. A page buffer, comprising:
at least one data latch storing a program verification result of a previous program loop among a plurality of program loops and program data to be stored in a memory cell;
a sensing latch storing a program verification result of a current program loop subsequent to the previous program loop among the plurality of program loops; and a bit line voltage controller updating the program verification result of the previous program loop, which is stored in the at least one data latch, to the sensing latch during a program operation of a next program loop subsequent to the current program loop among the plurality of program loops.

8. The page buffer of claim 7, wherein the bit line voltage controller controls a voltage of a bit line coupled to the memory cell based on the program verification result of the previous program loop, which is updated to the sensing latch, and the program verification result of the current program loop.

9. The page buffer of claim 8, wherein the bit line voltage controller controls the voltage of the bit line by applying a program permission voltage or a program inhibition voltage to the bit line based on the program verification result of the previous program loop and the program verification result of the current program loop.

10. The page buffer of claim 7, wherein the bit line voltage controller updates the program verification result of the current program loop, which is stored in the sensing latch, to the at least one data latch during the program operation of the next program loop.

11. The page buffer of claim 7, wherein the bit line voltage controller stores data sensed from the memory cell in the sensing latch or controls a voltage of a bit line coupled to the memory cell based on the data stored in the sensing latch.

12. A page buffer, comprising:
at least one data latch storing a program verification result of a first program loop, among the first program loop, a second program loop, and a third program loop which are sequentially performed, and program data to be stored in a memory cell;
a sensing latch storing a program verification result of the second program loop; and
a bit line voltage controller updating the program verification result of the first program loop, which is stored in the at least one data latch, to the sensing latch during a program operation of the third program loop.

13. The page buffer of claim 12, wherein the bit line voltage controller sets up a voltage of a bit line coupled to the memory cell based on the program verification result of the first program loop, which is updated to the sensing latch, and the program verification result of the second program loop.

14. The page buffer of claim 13, wherein the bit line voltage controller sets up the voltage of the bit line by applying a program permission voltage or a program inhibition voltage to the bit line based on the program verification results of the first and second program loops.

15. The page buffer of claim 12, wherein the bit line voltage controller updates the program verification result of the second program loop, which is stored in the sensing latch, to the at least one data latch during the program operation of the third program loop.

16. The page buffer of claim 12, wherein the bit line voltage controller stores data sensed from the memory cell in the sensing latch or controls a voltage of a bit line coupled to the memory cell based on the data stored in the sensing latch.

17. The page buffer of claim 12, wherein the first, second, and third program loops are performed by an Incremental Step Pulse Program scheme.

18. A circuitry comprising:
a first latch and a second latch that are coupled to a bit line; and
a control logic configured to sequentially perform first to third program loops to store, in a memory cell coupled to the bit line, data latched in the second latch,
wherein the control logic is configured to control the second latch to further latch a first program verification result of the first program loop and the first latch to latch a second program verification result of the second program loop, and
wherein, during the third program loop, the control logic is configured to:
control the first latch to further latch the first program verification result from the second latch,
set up the bit line based on the first program verification result and the second program verification result from the first latch, and
control the second latch to further latch the second program verification result from the first latch.

* * * * *

UNITED STATES PATENT AND TRADEMARK OFFICE
CERTIFICATE OF CORRECTION

PATENT NO. : 11,367,492 B2
APPLICATION NO. : 17/154337
DATED : June 21, 2022
INVENTOR(S) : Hyung Jin Choi It is certified that error appears in the above-identified patent and that said Letters Patent is hereby corrected as shown below:

On the Title Page

Item (54) and in the Specification Column 1, Lines 1-2 should be corrected to read:
"PAGE BUFFER AND OPERATING METHOD THEREOF AND CIRCUITRY"

Signed and Sealed this
Twenty-third Day of August, 2022

Katherine Kelly Vidal
*Director of the United States Patent and Trademark Office*